(12) United States Patent
Nguyen et al.

(10) Patent No.: US 11,750,207 B2
(45) Date of Patent: Sep. 5, 2023

(54) PHASE DETECTOR DEVICES AND CORRESPONDING TIME-INTERLEAVING SYSTEMS

(71) Applicant: Marvell Asia Pte Ltd., Singapore (SG)

(72) Inventors: Ray Luan Nguyen, Irvine, CA (US); Geoffrey Hatcher, Irvine, CA (US)

(73) Assignee: Marvell Asia Pte Ltd., Singapore (SG)

( * ) Notice: Subject to any disclaimer, the term of this patent is extended or adjusted under 35 U.S.C. 154(b) by 0 days.

(21) Appl. No.: 17/722,749

(22) Filed: Apr. 18, 2022

(65) Prior Publication Data

US 2022/0271766 A1 Aug. 25, 2022

Related U.S. Application Data

(63) Continuation of application No. 17/183,919, filed on Feb. 24, 2021, now Pat. No. 11,309,904.

(51) Int. Cl.
*H03M 1/12* (2006.01)
*H03M 1/28* (2006.01)
*H03M 1/36* (2006.01)
*H03M 1/06* (2006.01)

(52) U.S. Cl.
CPC ....... *H03M 1/1215* (2013.01); *H03M 1/0626* (2013.01); *H03M 1/1255* (2013.01); *H03M 1/282* (2013.01); *H03M 1/362* (2013.01)

(58) Field of Classification Search
CPC ............. H03M 1/1215; H03M 1/0626; H03M 1/1255; H03M 1/282; H03M 1/362; H03M 1/0624; H03M 1/1061; H04J 3/0617; H04J 3/16

USPC .......................................................... 341/155
See application file for complete search history.

(56) References Cited

U.S. PATENT DOCUMENTS

| 5,977,796 | A | 11/1999 | Gabara |
| 6,111,431 | A | 8/2000 | Estrada |
| 6,118,438 | A | 9/2000 | Ho |
| 6,316,964 | B1 | 11/2001 | Watarai |
| 6,417,708 | B1 | 7/2002 | Fiedler |
| 6,552,582 | B1 | 4/2003 | Bryan et al. |
| 6,686,772 | B2 | 2/2004 | Li et al. |

(Continued)

OTHER PUBLICATIONS

European Search Report for European Application No. EP 21 20 6212 dated Mar. 31, 2022.

(Continued)

*Primary Examiner* — Khai M Nguyen

(57) ABSTRACT

A multi-instance time-interleaving (TI) system and method of operation therefor. The system includes a plurality of TI devices, each with a plurality of clock generation units (CGUs) coupled to an interleaver network. Within each TI device, the plurality of CGUs provides a plurality of clock signals needed by the interleaver network. A phase detector device is coupled to the plurality of TI devices and configured to determine any phase differences between the clock signals of a designated reference TI device and the corresponding clock signals of each other TI device. To determine the phase differences, the phase detector can use a logic comparator configuration, a time-to-digital converter (TDC) configuration, or an auto-correlation configuration. The phases of the clock signals of each other TI device can be aligned to the reference TI device using internal phase control, retimers, delay cells, finite state machines, or the like.

24 Claims, 10 Drawing Sheets

(56) References Cited

U.S. PATENT DOCUMENTS

| | | | |
|---|---|---|---|
| 7,728,753 B2* | 6/2010 | Taft | H03M 1/0624 341/165 |
| 8,086,208 B2 | 12/2011 | Cook et al. | |
| 8,638,130 B1 | 1/2014 | Olsen | |
| 9,219,490 B1 | 12/2015 | Pereira et al. | |
| 9,496,840 B2 | 11/2016 | Lemkin et al. | |
| 9,647,643 B2 | 5/2017 | Gorecki et al. | |
| 10,110,204 B2 | 10/2018 | Gorecki et al. | |
| 10,374,838 B2 | 8/2019 | Jiang et al. | |
| 10,790,845 B1* | 9/2020 | Zanchi | H03M 1/0836 |
| 10,873,486 B1 | 12/2020 | Aboudina et al. | |
| 11,157,037 B1 | 10/2021 | Nguyen et al. | |
| 11,309,904 B1 | 4/2022 | Nguyen et al. | |
| 11,507,129 B2 | 11/2022 | Nguyen et al. | |
| 2003/0094977 A1 | 5/2003 | Li et al. | |
| 2006/0151851 A1 | 7/2006 | Pillai et al. | |
| 2008/0191774 A1 | 8/2008 | Lytollis | |
| 2008/0246511 A1 | 10/2008 | Miura et al. | |
| 2009/0167400 A1 | 7/2009 | Tokunaga et al. | |
| 2010/0060320 A1 | 3/2010 | Lee | |
| 2010/0153041 A1 | 6/2010 | Doris | |
| 2011/0204930 A1 | 8/2011 | Agarwal et al. | |
| 2014/0040700 A1 | 2/2014 | Kobori et al. | |
| 2014/0232575 A1 | 8/2014 | Le Dortz et al. | |
| 2015/0070065 A1 | 3/2015 | Dedic et al. | |
| 2016/0056799 A1 | 2/2016 | Ximenes et al. | |
| 2016/0240230 A1 | 8/2016 | Lee | |
| 2018/0275230 A1 | 9/2018 | Trakimas | |
| 2020/0059222 A1 | 2/2020 | Cheung et al. | |
| 2020/0195265 A1 | 6/2020 | Ali et al. | |
| 2020/0319893 A1 | 10/2020 | Wilkinson | |
| 2020/0349420 A1 | 11/2020 | Ovsiannikov et al. | |
| 2021/0021278 A1 | 1/2021 | Belostotski et al. | |
| 2021/0135678 A1 | 5/2021 | Pu et al. | |
| 2021/0184637 A1 | 6/2021 | Zanchi | |
| 2022/0200532 A1 | 6/2022 | Agrawal et al. | |

OTHER PUBLICATIONS

Kexu Sun, "A 56-GS/s 8-Bit Time-Interleaved SAR ADC in 28-nm CMOS", Electrical Engineering, Southern Methodist University, May 19, 2018 (Year: 2018).

Naftali Weiss, "Ultra-Wideband Multi-Phase Clock Generation for 200+GS/s Time Interleaved ADCs", Graduate Department of Electrical and Computer Engineering, University of Toronto, 2019 (Year: 2019).

Yizhak Shifman, Yael Krupnik, Udi Virobnik, Ahmad Khairi, Yosi Sanhedrai and Ariel Cohen, "A 1.64mW Differential Super Source-Follower Buffer with 9.7GHz BW and 43dB PSRR for Time Interleaved ADC Applications in 10nm", Intel Corporation, IEEE Asian Solid-State Circuits Conference, Nov. 4-6, 2019 (Year: 2019).

Cordova et al. "A Hierarchical Track and Hold Circuit for High Speed ADC-Based Receivers in 22nm FDSOI", 2019 26th IEEE International Conference on Electronics, Circuits and Systems (ICECS), Nov. 27-29, 2019 (Year: 2019).

San Deep Gupta et al., "A 1 GS/s 11 b Time-Interleaved ADC in 0.131-Im CMOS", Proceedings of the 2006 International Solid State Circuit Conference, Feb. 8, 2006, Session 31-6.

Tang Kai et al., "A 20GSps Track-and-Hold Circuit in 90nm CMOS Technology", 2012 International Conference on Advanced Technologies for Communications, 2012, pp. 237-240.

Shahriar Shahramian et al., "A 30-GS/s Track and Hold Amplifier in 0.13-IJm CMOS Technology", IEEE 2006 Custom Integrated Circuits Conference, 2006, pp. 493-496.

Simon Louwsma et al., "A Time-Interleaved Track & Hold in 0.131-Im CMOS sub-sampling a 4 GHz Signal with 43dB SNDR", IEEE 2007 Custom Integrated Circuits Conference, 2007, pp. 329-332.

Cheng-Chung Hus et al., "An 11 b 800MS/s Time-Interleaved ADC w1h Digital Background Calibration", Proceedings of the 2007 International Solid State Circuit Conference, Feb. 14, 2007, pp. 464-465, 615.

Francesco Centurelli et al., "Design Solutions for Sample-and-Hold Circuits in CMOS Nanometer Technologies", IEEE Transactions of Circuits and Systems-11: Express Briefs, Jun. 2009, pp. 459-463, vol. 56, No. 6.

International Search Report and Written Opinion corresponding to International Application No. PCT/US2022/012263 dated Apr. 26, 2022, 10 pages.

Athreya Shankarram et al: "Clock Synchronous Reset and Skew Calibration of 65GS/s ADCs in A Multi-Lane Coherent Receiver", ESSCIRC 2018—IEEE 44th European Solid State Circuits Conference (ESSCIRC), IEEE, Sep. 3, 2018 (Sep. 3, 2018), pp. 250-253, XP033420659, DOI: 10.1109/ESSCIRC.2018.8494254 [retrieved on Oct. 16, 2018].

Luca Vercesi et al.: "Two-Dimensions Vernier Time-to-Digital Converter", IEEE Journal of Solid-State Circuits, IEEE, USA, vol. 45, No. 8, Aug. 1, 2010 (Aug. 1, 2010), pp. 1504-1512, XP011314246, ISSN: 0018-9200, DOI: 10.1109/JSSC.2010.2047435 *Section III. C; Section IV.A; figures 4,5,8*.

Lingli Xia et al: "Sub-2-ps, Static Phase Technique Incorporating Measurement Uncertainty Cancellation for Multi-Time-T/H Circuits", IEEE Transactions on Circuits and Systems IEEE, US, vol. 59, No. 2, 1 (Feb. 2012-pp. XP011394661, ISSN: 1549-8328, DOI: figures 1, 4, 5, 9.

* cited by examiner

Network of multiple TI Instances $y_0, y_1, ..., y_{H-1}$

Misaligned $y_0, y_1, ..., y_{H-1}$

Aligned

PHASE DETECTOR DEVICES AND CORRESPONDING TIME-INTERLEAVING SYSTEMS

CROSS-REFERENCES TO RELATED APPLICATIONS

The present disclosure is a continuation of U.S. patent application Ser. No. 17/183,919, filed on Feb. 24, 2021. The entire disclosure of the application referenced above is incorporated herein by reference.

The present application incorporates by reference, for all purposes, the following patent application, commonly owned: U.S. patent application Ser. No. 17/097,791 (now U.S. Pat. No. 11,157,037), titled "METHOD AND DEVICE FOR CLOCK GENERATION AND SYNCHRONIZATION FOR TIME INTERLEAVED NETWORKS, filed Nov. 13, 2020.

BACKGROUND OF THE INVENTION

The present invention generally relates to interleaving systems and integrated circuit (IC) devices. More specifically, the present invention provides for a method and device for synchronization of large-scale systems with multiple time-interleaving (TI) sub-systems.

Over the last few decades, the use of communication networks has exploded. In the early days of the Internet, popular applications were limited to emails, bulletin boards, and mostly informational and text-based web page surfing. The amount of data transferred by such applications was relatively small. Today, the Internet and mobile applications demand a huge amount of bandwidth for transferring photo, video, music, and other multimedia files. For example, a social networking platform can process more than 500 TB of data daily. With such high demands on data storage and data transfer, existing data communication systems need to be improved to address these needs.

To address the rapidly rising demand for greater operational speed and data throughput, clocking architectures need to evolve and adapt to exploit every aspect of technological advantage while keeping power commensurate with scaling trends. Time interleaving involves simultaneously processing signal data through a plurality of parallel channels configured to a defined clocking relationship to produce a combined output at a greater effective rate. However, efficient time interleaving networks are difficult to design due to nonlinearities, gain/offset mismatches, timing errors, etc.

There have been many conventional types of methods and devices for synchronization of multi-instance TI systems. Unfortunately, such conventional methods and devices suffer from various drawbacks, including increased chip area, production cost, power consumption, etc. Therefore, improved multi-instance TI systems with devices and methods using more efficient alignment of such networks are highly desired.

BRIEF SUMMARY OF THE INVENTION

The present invention generally relates to time-interleaving systems and integrated circuit (IC) devices. More specifically, the present invention provides for a method and device for the synchronization of large-scale systems with multiple time-interleaving (TI) sub-systems. These TI sub-systems can be configured for a variety of applications, such as those for analog-to-digital conversion (ADC), digital-to-analog conversion (DAC), parallel computing, optical, serializer/deserializer (SerDes), and the like.

In an example, the present invention provides a multi-instance TI system having a phase detector and a plurality of TI devices (each a multi-layer TI system). Each of the TI devices includes a plurality of dividers, and the phase detector is configured to determine the phase difference between the divider output clocks of a designated reference TI device and those of the remaining TI devices of the multi-instance TI system. Further, each of the TI devices can include a multiplexer or each of the TI devices can be coupled to a multiplexer stage having a plurality of multiplexers coupled to each of the TI devices.

In a specific example, the phase detector is configured to compare divider output clocks of the reference TI device to the divider output clocks of each other TI device, progressing from the highest-level divider to the lowest-level divider, one level at a time. These divider output clocks are sent to a common sense point (e.g., the phase detector, a buffer stage prior to the phase detector, or the like) using multiplexers. In this manner, each of the dividers of the other TI devices can be compared to each of the dividers of the reference TI device, from the highest to lowest, in a round-robin fashion.

In a specific example, the phase detector configured to perform alignment via detection using an XOR/XNOR gate phase detection device or a Time-to-Digital converter (TDC) device. In another specific example, the phase detector can be configured to perform alignment via statistical correlation using autocorrelation of the TI device outputs based on predetermined input patterns or autocorrelation of the TI device outputs based on alternating predetermined state patterns.

Many benefits are recognized through various embodiments of the present invention. Such benefits include more efficient multi-instance TI systems and methods with synchronous outputs compared to conventional multi-instance TI systems and methods, improved re-timing margins using negative phase stepping, and a highly scalable architecture for multi-layer and multi-instance TI systems. Depending upon the embodiment, the techniques implemented in the present invention are also cost-effective and relatively simple to implement. Other such benefits will be recognized by those of ordinary skill in the art.

The present invention achieves these benefits and others in the context of known IC fabrication processes. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
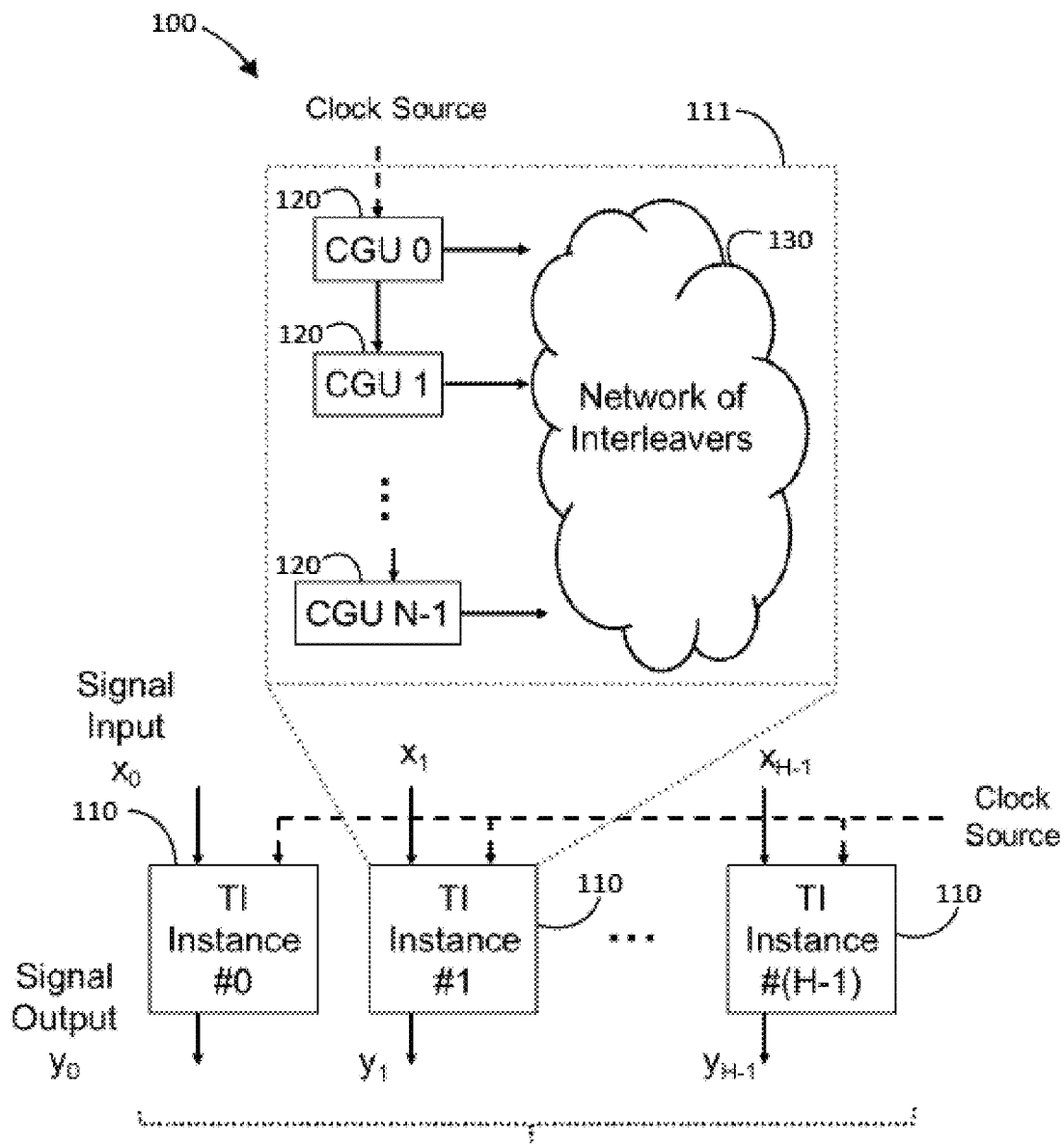
FIG. 1 is a simplified block diagram illustrating a network system of multiple time-interleaving (TI) instances according to an example of the present invention.

The present invention generally relates to time-interleaving systems and integrated circuit (IC) devices. More specifically, the present invention provides for a method and device for synchronization of large-scale systems with multiple interleaving sub-systems. These TI sub-systems can be configured for a variety of applications, such as those for analog-to-digital conversion (ADC), digital-to-analog conversion (DAC), parallel computing, optical, serializer/deserializer (SerDes), and the like.

As technology progresses and the need to push data throughput continues to rapidly rise, systems in ICs nearly double their sampling rates at every new generation and technological node. To enable such rapid rise in operational speed, be it computing or data conversion, clocking architectures need to evolve and adapt to exploit every aspect of technological advantage while keeping power commensurate with scaling trends. According to an example, the present invention aims to devise fundamental synchronization techniques for large-scale systems with multiple interleaving sub-systems where the total system output includes the collective network of all its sub-systems' outputs, such as time interleaving (TI) systems, and the like.

The present invention provides several methods and devices using techniques to synchronize large-scale interleaving systems having multiple TI instances. The order of the steps discussed are not necessarily mandated and any of the steps can be omitted, shuffled or modified depending on the applications and skills of the individual practicing the art. Nevertheless, examples of the present invention shall generalize in any and all interleaving scenarios or systems with multiple time-interleaving instances. Further details of various examples of the present invention are discussed below.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counterclockwise have been used for convenience purposes only and are not intended to imply any particular fixed direction. Instead, they are used to reflect relative locations and/or directions between various portions of an object.

FIG. 1 is a simplified block diagram illustrating a network system of multiple time-interleaving (TI) instances according to an example of the present invention. As shown, system 100 includes a plurality of TI instances 110, each of the TI instances receiving one or more clock signals from a clock source. The expanded view 111 shows an example configuration of a TI instance 110 having a plurality of clock generation units (CGUs) 120 coupled to a network of interleavers 130. Each of these CGUs receive one or more clock signals from the clock source and provides a certain clock signal of a designated frequency to the interleaver network 130. System 100 can be a typical multi-TI system having a large-scale network of H TI instances, each of which by itself can be another large-scale network or, at the lowest level, an N-layer interleaving system, a network of many interleaving elements (as shown in view 111), or the like.

In an example, these TI instances operate on the same beat or fundamental frequency, even though the actual source clocks may physically be common or different. This large-scale network can be configured to process a set of input signal tensors $x_0 \ldots x_{H-1}$ of arbitrary dimensions and to produce a corresponding set of output signal tensors $y_0 \ldots y_{H-1}$, also of arbitrary dimensions. These signal tensors can be used for many applications, such as signal processing, data analysis, machine learning, and the like.

In an example, the plurality of CGUs can be configured to generate the necessary phases for all its sub-elements or lower level interleavers of the interleaver network 130. Examples of such CGUs include but are not limited to crystal oscillators, phase-locked loop (PLL), and CMOS dividers used in integrated circuits. Of course, there can be other variations, modifications, and alternatives.

Figure 2A:
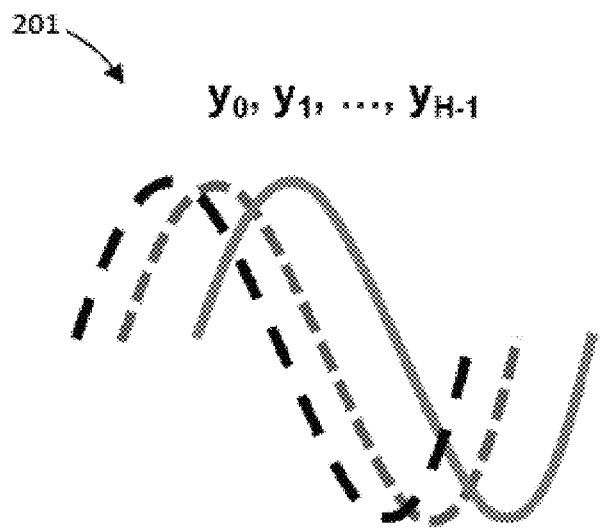
FIG. 2A is a simplified graph illustrating misaligned signals in a multiple-TI instance network.
Figure 2B:
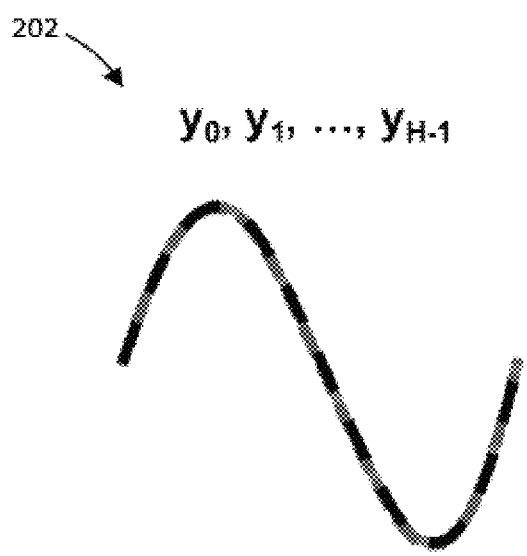
FIG. 2B is a simplified graph illustrating aligned signals in a multiple-TI instance according to an example of the present invention.

Due to uncertainty in clock states upon system startup, however, the output tensors $y_0 \ldots y_{H-1}$ may become misaligned in time or phase relationships (see FIGS. 2A and 2B for a simple case of 1-dimensional sinusoidal outputs with and without alignment). In applications these interleaved outputs need to be synchronized in time or phase relationships, these CGUs must be algorithmically adjusted to achieve correct alignment.

FIG. 2A is a simplified graph illustrating misaligned signals in a multiple-TI instance network. As shown, graph 201 shows a plurality of 1-dimensional sinusoidal outputs that are misaligned, representing misaligned output signal tensors of a multiple interleaving instance system. In contrast to FIG. 2A, FIG. 2B is a simplified graph illustrating aligned signals in a multiple-TI instance according to an example of the present invention. Here, graph 202 shows the same plurality of 1-dimensional sinusoidal outputs now aligned.

In commercial applications, we often have more than one TI system instances operating in parallel with each other (see FIG. 1). In such scenarios, these TI system instances may have different phases that may be misaligned due to the random starting states of various dividers throughout the clock tree. As a result, the outputs of these instances may be misaligned when interfacing with the external world (see FIG. 2A), which is undesirable. To align all of the divider phases, the present invention provides for using alignment via detection, alignment via statistical correlation, and the like and combinations thereof.

A method of operating a multiple instance TI system (or multi-instance TI system) using alignment via detection according to an example of the present invention is briefly described as follows:
1. Designate one of the TI instances as a reference TI instance for the multi-instance TI system;
2. Send all divider output clocks from all TI instances of the multi-instance TI system to a phase detector device using multiplexers;
3. For each other TI instance as a target TI instance, determine the phase difference between divider output clocks of the reference TI instance and the corresponding divider output clocks of the target TI instance using the phase detector;
4. For each target TI instance, retiming the divider output clocks of the target TI instance to corresponding divider output clocks of the reference TI instance using its own internal phase control, retimers, finite state machine, or the like.

The above sequence of steps is used to operate a multi-instance TI system to align the divider phases of a plurality of TI devices (i.e., TI system instances) according to an embodiment of the present invention. Depending upon the embodiment, one or more of these steps can be combined, or removed, or other steps may be added without departing from the scope of the claims herein. One of ordinary skill in the art would recognize other variations, modifications, and alternatives.

In an example, the present invention provides a multi-instance TI system having a phase detector and a plurality of TI devices. Each of the TI devices includes a plurality of dividers, and the phase detector is configured to determine the phase difference between the divider output clocks of a designated reference TI device and those of the remaining TI devices of the multi-instance TI system. Further, each of the TI devices can include a multiplexer or each of the TI devices can be coupled to a multiplexer stage having a plurality of multiplexers coupled to each of the TI devices.

In a specific example, the phase detector is configured to compare divider output clocks of the reference TI device to the divider output clocks of each other TI device, progressing from the highest-level divider to the lowest-level divider, one level at a time. These divider output clocks are sent to a common sense point (e.g., the phase detector, a buffer stage prior to the phase detector, or the like) using multiplexers. In this manner, each of the dividers of the other TI devices can be compared to each of the dividers of the reference TI device, from the highest to lowest, in a round-robin fashion. The comparison order can also be performed in other fashions, such as lowest to highest, or as a binary grouped tree, and the like (instead of round-robin) to reduce the number of comparisons. However, these choices come with certain restrictions of the types of dividers that normally increase implementation cost and complexity. In this case, use of the round-robin comparison process is merely an example of this invention due to its simplicity and wide applicability. Regardless of the chosen alignment algorithm, however, it is critical that all instances (i.e., all TI devices in the multi-instance TI system) of multiplexers, dividers, and layout routing be matched well enough such that detection errors that arise from their mismatches be kept to a minimum. Of course, there can be other variations, modifications, and alternatives.

Consider a 4-16-8 TI network system of a plurality of TI devices/instances, in which each TI device includes a divide-by-4 (Div-4) and a divide-by-8 (Div-8) dividers and is configured to receive four input clock phases and to produce 128 output clock phases. In this case, the system can have one TI device that is misaligned to another TI device from random starting points of its Div-4) and Div-8 dividers. In an example application of the method described previously, the present invention provides for a method of aligning these two dividers starting from the highest-level divider Div-4 and progressing downward through the interleaving tree towards the lowest-level divider Div-8. Further details are discussed in reference to FIG. 3.

Figure 3:
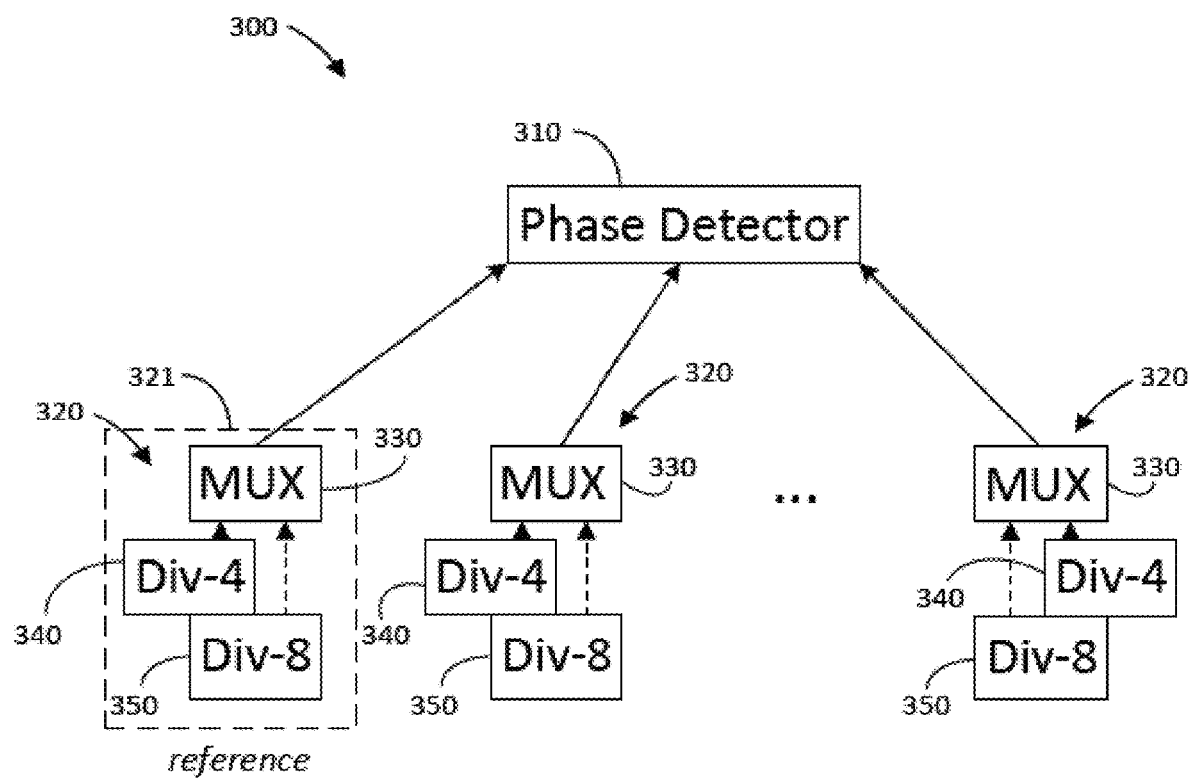
FIG. 3 is a simplified block diagram illustrating a multiple TI instance system configured to align the outputs of a plurality of TI devices (i.e., TI system instances) using a phase detector according to an example of the present invention.

FIG. 3 is a simplified block diagram illustrating a multiple TI instance system 300 configured to align the outputs of a plurality of TI devices (i.e., TI system instances) using a phase detector according to an example of the present invention. As shown, device 300 includes a phase detector 310 coupled to a plurality of TI devices 320 via a plurality of multiplexers 330. The multiplexers 330 can be configured within each TI device 320 (as shown) or separate from the TI devices 320. In this case, each TI device 320 is a 2-layer 4-16-8 TI system, including a Div-4 divider 340 and a Div-8 divider 350. However, the TI devices 320 can be different multi-layer TI devices, such as a 3-layer TI system or a TI system having more layers/dimensions. According to an example, one of the TI devices 320 is designated as the reference (marked by dotted region 321), and all other branches are aligned to the reference branch in a round-robin fashion, or in other fashions as discussed previously.

In an example, the phase detector is configured to determine the difference in phase between the reference TI device and each of the other TI devices. The reference divider outputs of the reference TI device are compared to the corresponding target divider outputs of a target TI device. In a specific example, the dividers of the reference and target TI devices are compared sequentially from the highest-level divider to the lowest-level divider. Referring to FIG. 3, an example of this process with the 4-16-8 TI devices is first comparing and aligning the Div-4 (i.e., the highest-level divider) of the reference and a target TI device, then comparing and aligning the Div-8 (i.e., the lowest-level divider) of the reference and the target TI device. As discussed previously, all target TI devices can be compared and aligned to the reference TI device in a round-robin fashion, or in other fashions. Those of ordinary skill in the art will recognize other variations, modifications, and alternatives.

To compare the divider states from two different divider outputs, the present invention provides for using various phase detector device architectures, including a phase detection device such as an XOR/XNOR gate type phase detector, a converter such as Time-to-Digital Converter (TDC) device, and the like and combinations thereof. The XOR/XNOR gate phase detection method is an analog type method of phase detection, while the TDC method is a digital type method of phase detection.

Figure 4A:
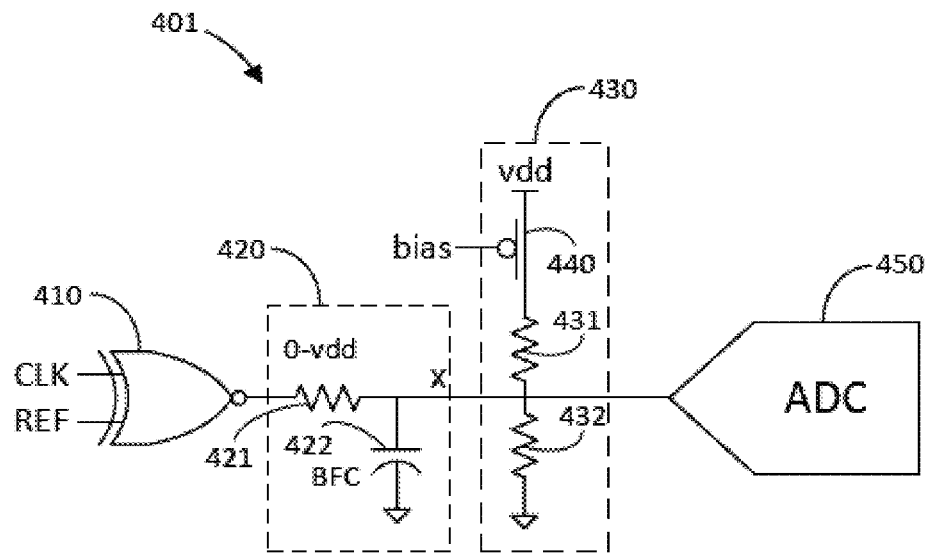
FIG. 4A is a simplified circuit diagram illustrating an XOR/XNOR gate phase detection device for comparing outputs according to an example of the present invention.

FIG. 4A is a simplified circuit diagram 401 illustrating an XOR/XNOR gate phase detection device for comparing outputs according to an example of the present invention. As shown, device 2001 includes an XNOR gate 410 configured to receive and compare a reference clock signal (REF) and a target clock signal (CLK). The XNOR gate 410 generates the phase difference between the REF and CLK signals and outputs the difference to a low-pass filter 420 to convert this time difference to the voltage domain.

As an example, the low-pass filter 420 includes a resistor 421 and capacitor 422 in a RC low-pass filter configuration. Following the RC low-pass filter stage is voltage divider stage 430 including a first resistor 431 coupled to a voltage source (Vdd) and a second resistor 432 coupled to ground. The voltage divider stage also includes a transistor 440 configured as a voltage-controlled resistor receiving a bias voltage (BIAS). The low-pass filter 420 is configured to convert the time difference between the REF and CLK signals to the voltage domain, which is then measured by an analog-to-digital converter (ADC) 450 coupled to the output of the low-pass filter 2020. Based on the measurement by the ADC 450, the phase of the dividers producing the CLK signals can be adjusted to be aligned to the dividers producing the REF signals by using retimers or a state machine implemented by a digital signal processor. Those of ordinary skill in the art will recognize other variations, modifications, alternatives.

Figure 4B:
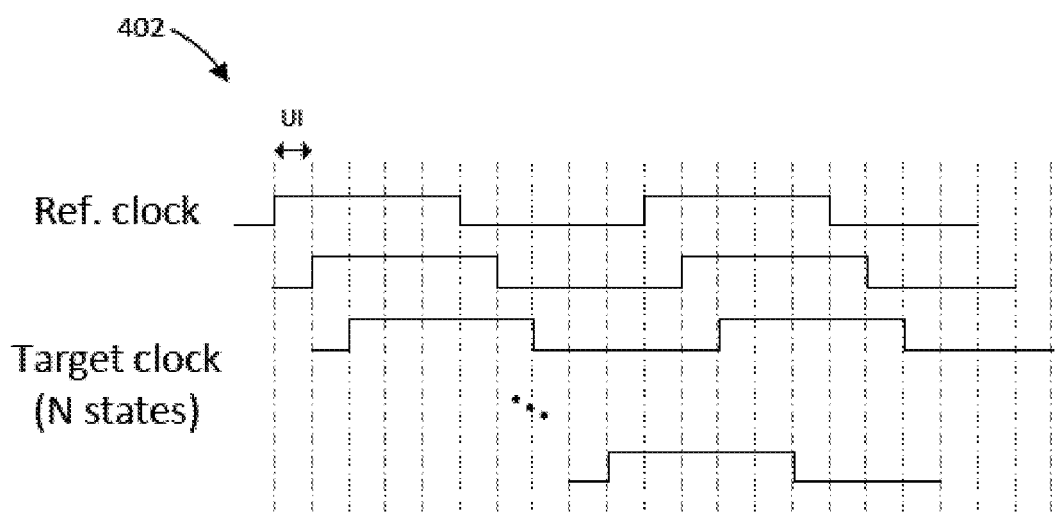
FIG. 4B is a simplified timing diagram illustrating the operating of the XOR/XNOR gate architecture as shown in FIG. 4A.

FIG. 4B is a simplified timing diagram 402 illustrating the operating of the XOR/XNOR gate architecture as shown in FIG. 4A. As shown, timing diagram 402 shows a reference clock and a plurality of target clocks having a total of N states. The reference clock signal can represent the output of a divider of the reference TI device 421 shown in FIG. 3. The plurality of target clocks can represent the rest of the plurality of outputs corresponding to the divider of the target TI devices 320 (i.e., all other TI devices in the multiple TI instance system) that will be aligned to the divider of the reference TI device 321.

Figure 5:
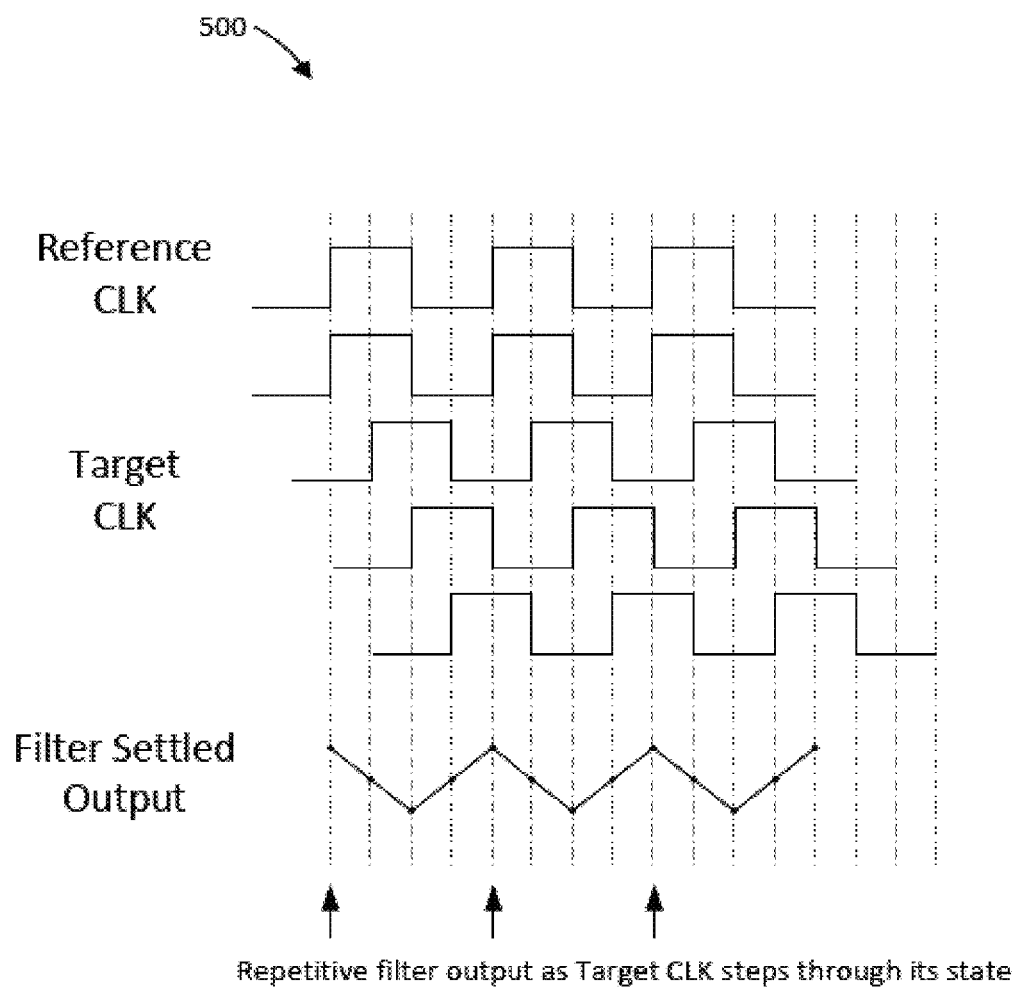
FIG. 5 is a simplified timing diagram illustrating a method of applying the phase detector device of FIG. 4A to the multiple TI instance device of FIG. 3 according to an example of the present invention.

FIG. 5 is a simplified timing diagram 500 illustrating a method of applying the phase detector device 401 of FIG. 4A to the multiple TI instance device 300 of FIG. 3 according to an example of the present invention. As shown, timing diagram 500 shows the outputs for the reference clock, the target clocks, and a filter settled output of the XNOR gate 410 of the phase detector device 401. Here, the target clock signals of the Div-4 divider 340 have four different states, which produces three possible voltages when fed to the XNOR gate 410 due to how well-matched or mismatched the two input phases are. A simple 2-bit ADC can detect the highest or lowest value, signifying that the two input divider states (reference and target) are either perfectly aligned or misaligned. As the phase detector device 401 cycles through the target divider output (i.e., target clock) states, the history of the divider state will repeat, which can serve as another metric indicating how far or close the different dividers are at alignment.

In the case of the Div-8 divider, the phase detector device 401 will detect five possible voltage levels due to how well-matched or mismatched the two input phases are. In an example, phase detection for a divider producing N states (i.e., Div-N) will have N/2+1 voltages depending on the matching/mismatching. The more levels that the phase detector needs to detect, the finer the resolution is required of the detection ADC. Thus, the ADC must have a resolution and range that is better than the N/2+1 voltage levels that it is trying to detect.

In another example, the phase detection device can achieve similar performance using an XOR gate configured to receive and compare the reference and target clock signals and feeding the output to a high-pass filter. Of course, there can be other variations, modifications, and alternatives.

Figure 6A:
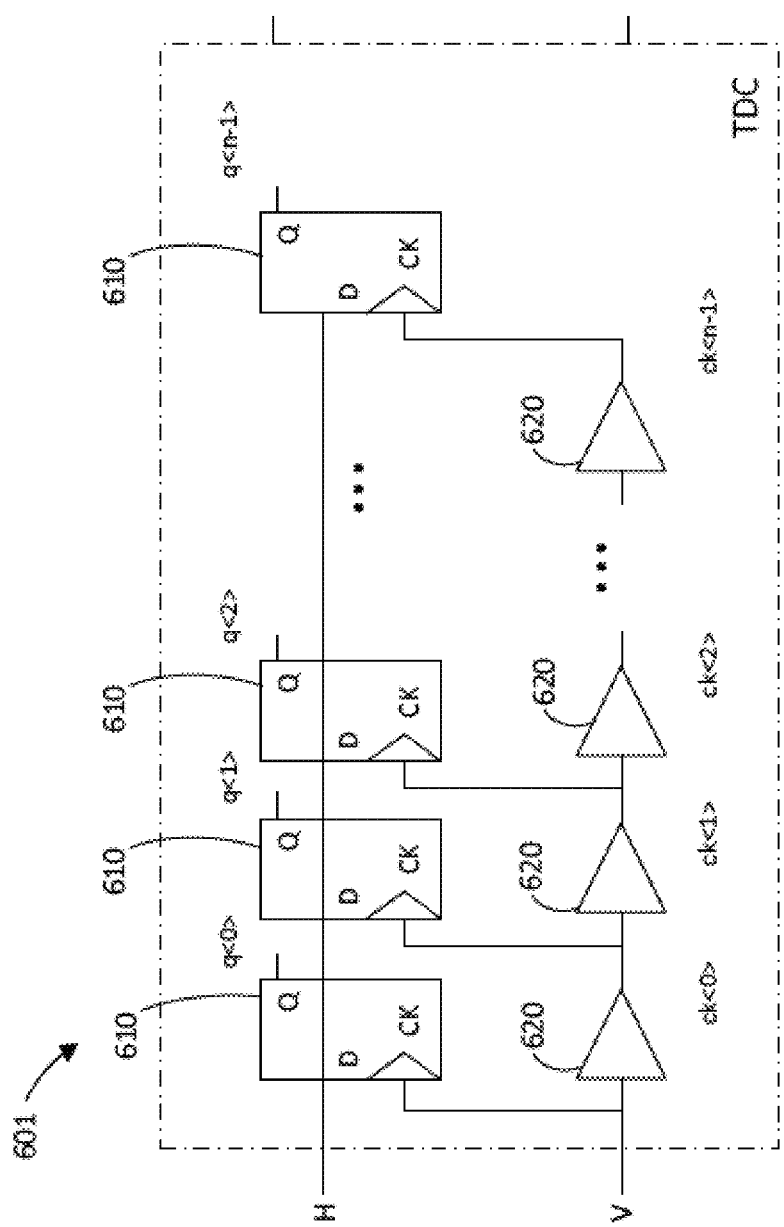
FIG. 6A is a simplified circuit block diagram illustrating a Time-to-Digital Converter (TDC) based phase detector device according to an example of the present invention.

In the Time-to-Digital Converter (TDC) method, a TDC device is configured with a sufficiently fine step size and length to measure the difference in states of two input clocks using a time grid. FIG. 6A is a simplified circuit block diagram illustrating a TDC-based phase detector device 601 according to an example of the present invention. As shown, device 601 includes a plurality of flip-flops 610 configured as a flip-flop chain that receives a first input clock signal (denoted as "H") and a plurality of buffer devices 620 configured as a buffer delay chain that receives a second input clock signal (denoted as "V"). Per this topology, the V signal is used to generate a time grid via the buffer delay chain, while the H signal is sampled by the flip-flop chain for comparison against the time-grid. Any two clock signals can be the H and V signals in this TDC method.

More specifically, the TDC device 601 is configured to generate a plurality of delay cell outputs from the plurality of buffer devices 620 using the V clock signal. This plurality of delay cell outputs that serves as a time grid that moves as one steps through the different states of the V clock. Using the time grid, the plurality of flip-flops 610 (e.g., D flip flops or the like) is configured to receive the H clock signal and to compare the H signal to the time grid to determine the phase/alignment difference between the H and V clock signals. Stated another way, the H clock signal received by the plurality of flip-flops 610 is sampled and retimed using the time-grid, shown by the clock inputs of the flip-flops 610 being coupled to the staggered outputs of the buffer devices 610. In a specific embodiment, the number of buffer devices and flip-flops are both determined by the total number of clock signals in each of the TI devices in the multiple TI instance system. Depending on the implementation (e.g., type of clock under comparison), the time-grid represents either the current TDC output or the history of the TDC output to be used to determine alignment states.

In an example, a clock buffer device can be used to provide the H and V clock signals to the TDC device 601. The clock buffer device can be configured to buffer a reference clock signal (REF) and a target clock signal (CLK) prior to TDC device 601 and send the REF and CLK signals in either order to the TDC device 601. In an example, the clock buffer device can include a delay chain having a plurality of inverters for each of the REF and CLK signals. An inverter in each delay chain can be configured with resistive feedback. Also, the inputs to the clock buffer device can have coupling capacitors. There can be other variations, modifications, and alternatives.

Figure 6B:
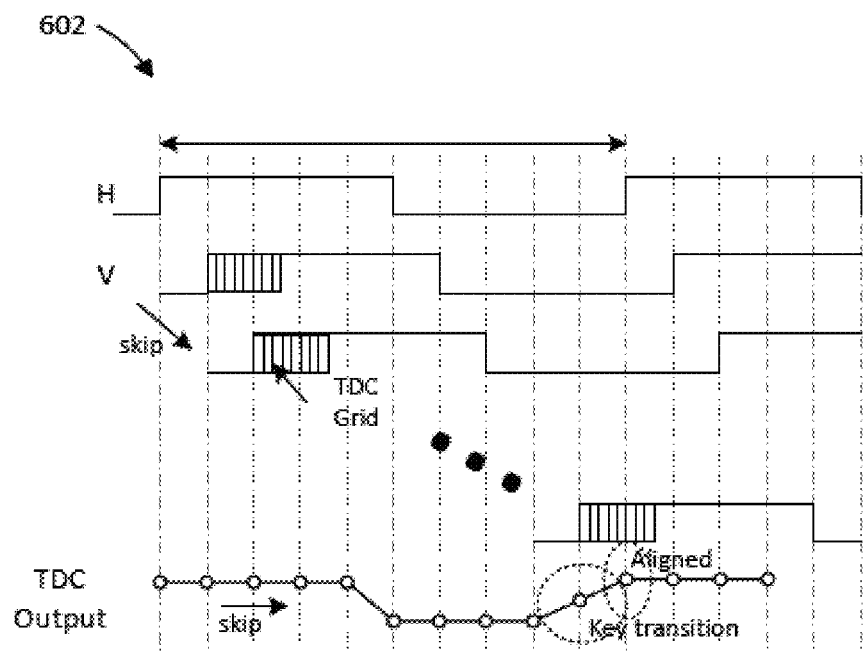
FIG. 6B is a simplified timing diagram illustrating a method of using a TDC based phase detector device according to an example of the present invention.

FIG. 6B is a simplified timing diagram 602 illustrating a method of using a TDC based phase detector device according to an example of the present invention. Timing diagram 602 shows how one clock input is used to generate a time grid via a delay chain, and this time grid is then used to sample the other clock via a chain of flip flops. When H and V are out of alignment, the TDC output is either all zeroes or all ones (these values may be skipped until a transition occurs). However, as one steps through the states of V, perfect alignment occurs at the moment the TDC outputs change from all zeroes to all ones (or vice versa). Depending on the length of the TDC, a "key transition state" (i.e., a mix of ones and zeroes) between the all zeros state and all ones state may or may not exist. In situations where this "key transition state" exists (shown in FIG. 6B), the "aligned state" is the state that immediately follows this "key transition state". As stated previously, either the history of the TDC output or the TDC output itself can be used to determine alignment states.

The higher the TDC resolution and the longer the TDC length, the better the detection results will be. In a specific example, requirements of the TDC can include that (1) the TDC must be less noisy than the smallest UI that it attempts to detect, and (2) the TDC length must be larger than 50% of the lowest frequency clock period by a sufficient margin such that the TDC does not get confused between states that are immediately adjacent to perfect alignment. Those of ordinary skill in the art will recognize other variations, modifications, and alternatives to the architecture and requirements of the TDC based phase detection system described previously.

Figure 6C:
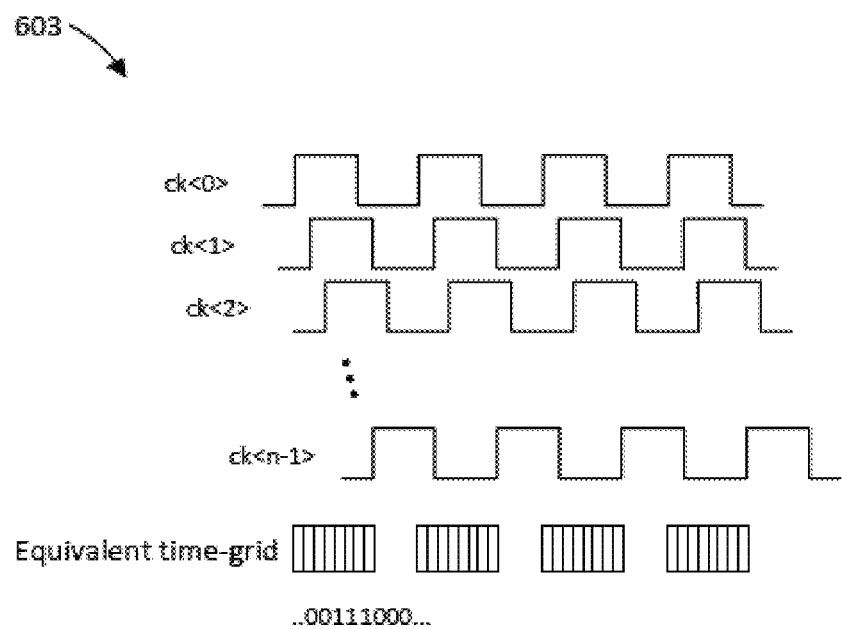
FIG. 6C is a simplified timing diagram illustrating a method of using a TDC based phase detector device according to an example of the present invention.

FIG. 6C is a simplified timing diagram 603 illustrating a method of using a TDC based phase detector device according to an example of the present invention. As shown, timing diagram 603 shows N target clock signals that are being evaluated by the TDC based phase detector device. At the bottom, an equivalent time grid is shown representing the time grids for each of the target clocks to be aligned to the reference clock.

Each of the phase detection methodologies described above can be used in combination with each other or with another similar method for redundancy in detection accuracy. In an example, both the XOR/XNOR gate phase detector and the TDC phase detector can be configured together via one or more multiplexers, which allows the system to select between the modes. Of course, there can be other variations, modifications, and alternatives.

The present invention also provides for using various statistical correlation-based device architectures, including auto-correlation using a pre-deterministic input signal pattern, pre-deterministic alternating state patterns, or multiple pre-deterministic patterns, or the like and combinations thereof. In certain applications where system inputs or states can be controlled, (such as analog-to-digital, digital-to-analog, any neural network, or the like), the signals going through the interleaving network can be altered (e.g., using a hardware implementation, firmware, a microprocessor, a microcontroller, or other embedded processing unit or the like) to create certain effects that can reveal the phase differences or internal clock stages. Any of the following topologies (and combinations thereof for redundancy in detection accuracy) can be implemented to align a plurality of interleaving sub-systems of a multi-instance interleaving network system.

Figure 7:
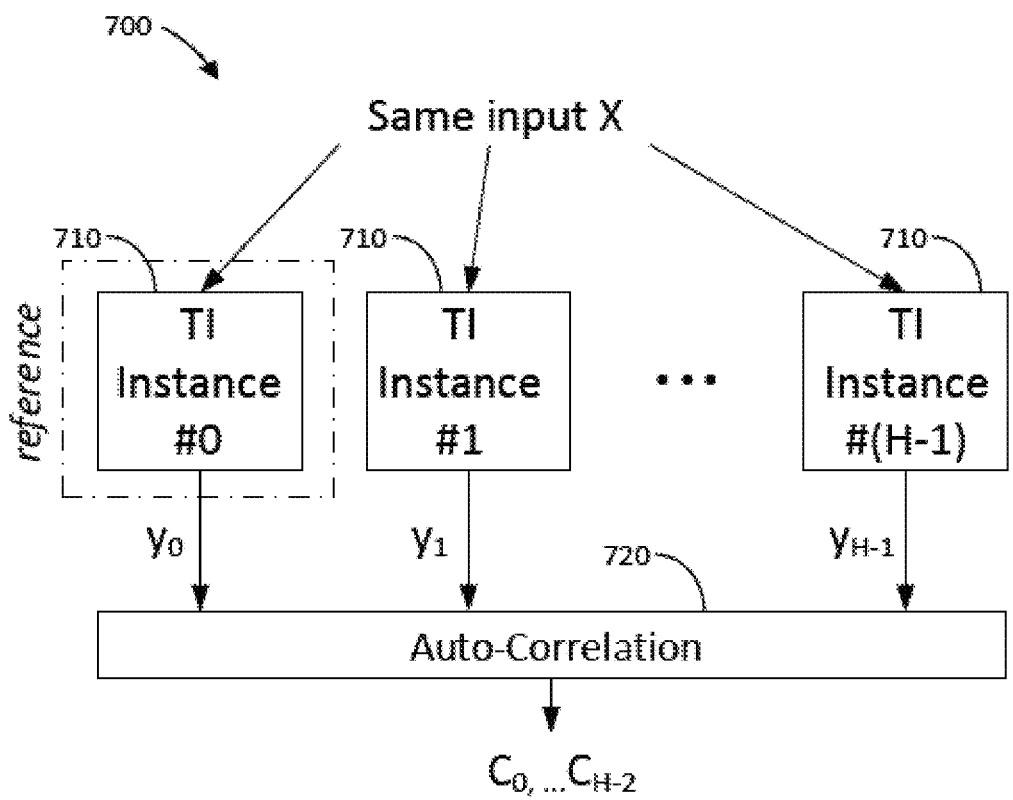
FIG. 7 is a simplified block diagram illustrating a multiple TI instance network using auto-correlation according to an example of the present invention.

FIG. 7 is a simplified block diagram illustrating a multiple TI instance network using auto-correlation according to an example of the present invention. As shown, system 700 includes a plurality of TI instances 710 coupled to an auto-correlation device 720. One of the instances can be designated as a reference instance (marked by dotted lines). Here, a pre-deterministic input pattern with a period larger than the period of the respective interleaved clock is fed to different TI instances 710 (through the interleaver network) and the auto-correlation of the resulting outputs is used to detect alignment. Alignment is achieved when output of the auto-correlation device 720 exhibits a maximum correlation value.

In a specific example, the requirements for this method and device topology can include the following: (1) the ability the switch the input data going into the TI system to a predetermined pattern on all TI instances to be aligned; (2) the pattern period is longer than the target clock period to be aligned; and (3) the auto-correlation output at max alignment is sufficiently higher than that of adjacent near-alignment states beyond the sum of all noise sources.

As a simple example for illustration, a common pseudo-random binary sequence (PRBS) or sinusoidal input can be fed into the system 700 shown in FIG. 7. Starting with instance #1, as its clock is forced through different states (e.g., via internal phase control, retimers, finite state machine, etc.) and auto-correlation device 720 measures the correlation between its output (i.e., auto-correlation output of instance #1) and that of instance #0 (i.e., reference instance), a certain pattern emerges that looks similar to FIGS. 8A and 8B. The maximum value of correlation occurs only when the two outputs are perfectly aligned, whether with a PRBS, ramp, periodic ramp, alternating periodic ramp, stair-case, spike, periodic spike, alternating periodic spike, sinusoidal, or other signal excitation. Thus, the alignment algorithm can keep stepping instance #1's clock state until this value is reached and subsequently proceed to the rest of the instances until all instances are similarly aligned to instance #0. Similar to the XOR/XNOR phase detector case, alignment via auto-correlation can be done in a round-robin fashion, or any other order depending upon the application.

Figures 8A, 8B:
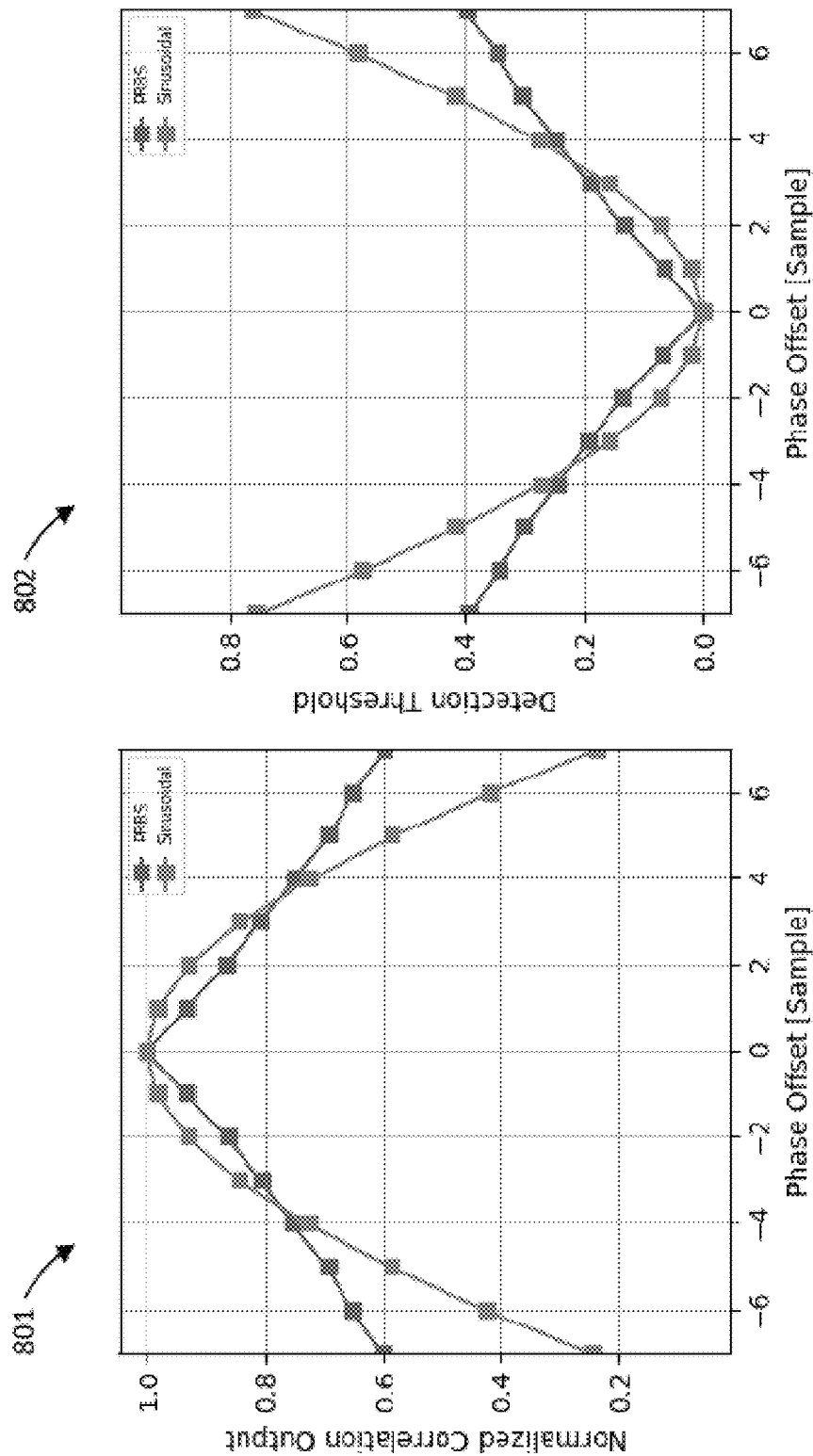
FIG. 8A is a simplified graph of normalized correlation outputs illustrating a method of auto-correlation using a common pseudorandom binary sequence (PRBS) input signal and a sinusoidal input signal according to an example of the present invention.
FIG. 8B is a simplified graph of detection thresholds illustrating a method of auto-correlation using a common PRBS input signal and a sinusoidal input signal according to an example of the present invention.

FIG. 8A is a simplified graph of normalized correlation outputs illustrating a method of auto-correlation using a common PRBS input signal and a sinusoidal input signal in a multi-instance TI system according to an example of the present invention. As shown, graph 801 illustrates the further a TI instance is away from a phase offset value of zero (i.e., perfect alignment), the closer the normalized correlation output is to one. This graph 801 shows a normalized version of the detection threshold graph 802 in FIG. 8B.

FIG. 8B is a simplified graph of detection thresholds illustrating a method of auto-correlation using a common PRBS input signal and a sinusoidal input signal in a multi-instance TI system according to an example of the present invention. As shown, graph 802 illustrates that the further a TI instance is away from a phase offset value of zero (i.e., perfect alignment), the smaller the correlation output. The difference in correlation value between perfect alignment and other non-aligned states is referred to as the "detection threshold", which is plotted against actual phase offset. As can be seen, the hardest states to detect are ones closest to phase offset=0, where the detection threshold is the lowest or closest to zero and must be sufficiently larger than the system noise to allow valid detection, as discussed previously.

In another example, instead of feeding the same input pattern to all interleaving instances, the internal states/bias points of the IT instances can be varied in a distinct and alternating state signature (e.g., between its normal and opposite state). The internal states of the IT instances can be modulated based on different variables (i.e., internal state variables), such as offset, gain, distortion properties, magnitude properties, and the like. The average autocorrelation of these alternating states over time creates a sufficiently distinct signature in the final output when their clocks are out of phase. Perfect alignment is achieved when the correlation value is maximized.

Consider an example of changing the offset with an alternating or predeterministic pattern in an i-th TI instance of system 700 shown in FIG. 7 with its output at time t written as follows:

$$y_i[t] = x_i[t] + \tilde{o}_i[t] + n_i[t]$$

where $x_i$ is a zero-mean signal, $\tilde{o}_i$ is its alternating offset, and $n_i$ is the noise associated with this instance. Whereas both $x_i$ and $n_i$ are stationary processes in time, the ~on top of $\tilde{o}_i$ signifies a quasi-stationary process with time-varying properties, such as time varying offsets and variances due to its alternating nature.

Given the above, the auto-correlation (AC) between this i-th instance and another k-th instance can described by the following equation:

$$AC = (x_i[t] + \tilde{o}_i[t] + n_i[t]) \odot (x_k[t] + \tilde{o}_k[t] + n_k[t]) = X_{ik}[t] + \tilde{o}_i[t] \odot \tilde{o}_k[t] + N_{ik}[t] = B + \tilde{O}_{ik}[t]$$

where $x_i[t]$ and $x_k[t]$ are the i-th and k-th instance signal output, respectively; $\tilde{o}_i[t]$ and $\tilde{o}_k[t]$ are the i-th and k-th instance offset, respectively; $n_i[t]$ and $n_k[t]$ are the i-th and k-th instance noise, respectively; $X_{ik}[t]$ is the auto-correlation of the i-th and k-th instance signal output; $N_{ik}[t]$ is the auto-correlation of the i-th and k-th instance noise; B is the bias value; and $\tilde{O}_{ik}[t]$ is the auto-correlation of the i-th and k-th instance offset.

In the above equation, the autocorrelation between any pair of types (e.g., signal and noise, offset and signal, noise and offset, etc.) reduce to zero, since they are statistically independent processes. Thus, auto-correlating two output patterns will reduce to a statistically constant bias term B that is proportional to the signal and noise energy plus a varying term $\tilde{O}_{ik}$ that depends on the position of the offset pattern. By cycling through different divider states (in the case of TI instances), this offset pattern is shifted around. When the auto-correlation output is maximized, then perfect aligned is achieved.

For auto-correlation using other state variable types (e.g., gain, distortion, magnitude, etc.), the associated auto-correlation function would replace the offset terms with the corresponding state terms and the addition operation would become multiplication in the case of gain. Referring to the above equation with i-th and k-th instances, corresponding state terms for alternating gain states would include $\tilde{g}_i[t]$ and $\tilde{g}_k[t]$ as the i-th and k-th instance gain and $\tilde{G}_{ik}[t]$ as the auto-correlation of the i-th and k-th instance as the result of gain variation. Those of ordinary skill in the art will recognize other variations, modifications, and alternatives.

Figure 9A:
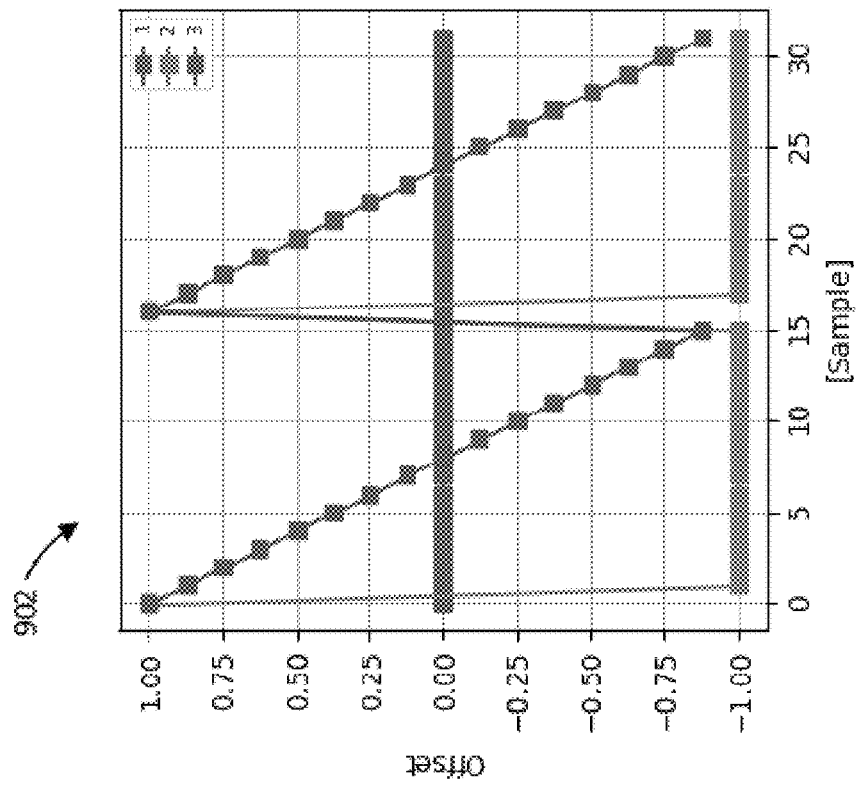
FIG. 9A is a simplified graph of normalized correlation outputs illustrating a method of auto-correlation using different offset patterns according to an example of the present invention.

FIG. 9A is a simplified graph of normalized correlation outputs illustrating a method of auto-correlation using different offset patterns in a multi-instance TI system according to an example of the present invention. As shown, graph 901 has three patterns plotted for demonstration: (1) no pattern; (2) periodic spike; and (3) periodic ramp. Similar to graph 801 of FIG. 8, graph 901 is a normalized version of the offset graph 902 in FIG. 9B. Opposite subplots are not shown here but can be envisioned as: Opposite State=–Normal State. Further, we apply the alternation of the two offset states (normal and opposite) with a 50% duty cycle in this example. Other duty cycles can be used as long as the selected duty cycle is factored in the calculation of the autocorrelation function.

Figure 9B:
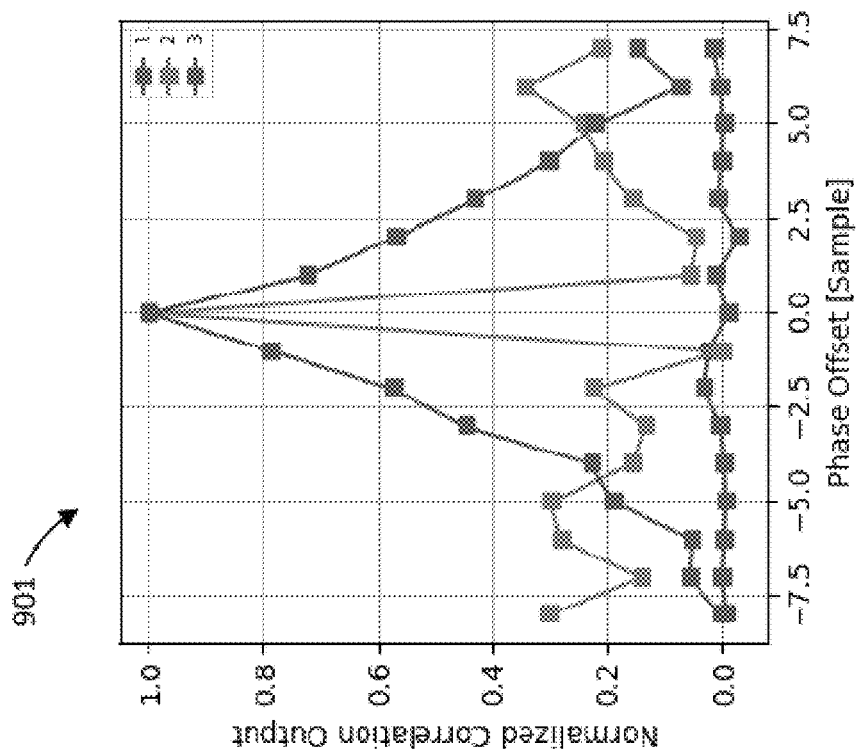
FIG. 9B is a simplified graph of detection thresholds illustrating a method of auto-correlation using different offset patterns according to an example of the present invention.

FIG. 9B is a simplified graph of detection thresholds illustrating a method of auto-correlation using different offset patterns in a multi-instance TI system according to an example of the present invention. As shown, graph 902 shows the average autocorrelation over time vs. interleaving phase offset of the three offset patterns discussed previously. These three offset scenarios can be described as follows:

1. Autocorrelation without offset programming resulting in all autocorrelation values being near zeros, regardless of the phase relationship between the two TI instances;
2. An alternating periodic spike offset pattern is used, which leads to an easy-to-detect autocorrelation transfer function with a sharp maximum peak at phase offset=0 (i.e., adjacent states to phase offset=0 are drastically smaller, leading to larger detection threshold and thus easier detection requirements;
3. A periodic ramp leads to a good autocorrelation transfer function but with milder characteristics (i.e., adjacent states are gradually smaller in autocorrelation value the further they are from zero phase offset, leading to smaller detection threshold compared to the alternating periodic spike offset pattern.

As shown in scenarios (2) and (3), the autocorrelation peak can be easily detected when perfect alignment occurs, demonstrating the effectiveness of this topology. Further, an advantage of this topology of the previous topology (same input patterns) is that it does not require switching the input to a pre-determined pattern, which can be a difficult requirement in certain applications. On the other hand, to make this algorithm work and depending on the specific applications, some or all of the following conditions must be satisfied. In a specific example, the requirements for the method and device topology can include the following: (1) the offset altering pattern must be the same (or sufficiently close enough) for all interleaving instances to allow for detectable autocorrelation of differences between adjacent states near the zero offset state; (2) the offset pattern fed to the interleavers have signal energy sufficiently greater than the total noise of the system; (3) the autocorrelation window (over which the above equation is computed) is sufficiently long to average out all noise effects and the effect of the offset pattern alternation; and (4) in certain applications, use of these alternating offset patterns across two or more interleaving instances must happen simultaneously(or at least concurrently close enough in time) such that the relative time errors of such offset applications do not result in larger than one phase offset sample in the final autocorrelation output.

Each of the auto-correlation methodologies described above can be used in combination with each other or with another similar method for redundancy in detection accuracy. Without loss of generality, those of ordinary skill in the art will recognize the many possibilities of combining any or all of the above methods and topologies, their variations, and alternatives to synchronize any large-scale interleaving systems. The correction of clock phases or states can either happen via programming a different state into the CGU trees of the individual TI instances or via manipulating their final outputs (e.g., via internal phase control, additional retimers and/or delay cells, finite state machine, etc.). Furthermore, even through the autocorrelation maximum is used as the condition for alignment, the inverse is also application in systems where opposite alignment is needed or if a TI instance's output sign is flipped. Regardless of the scenarios, the methods and topologies presently described should provide sufficient granularity or resolution in the final phase detection such that almost any desired discrete phase relationship can be targeted for alignment.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A phase detector device for a time-interleaving (TI) system, the phase detector device comprising:
   inputs configured to receive respective pluralities of clock signals from a plurality of TI devices, each of the respective pluralities of clock signals being generated by a plurality of clock generating units (CGUs) of a respective one of the plurality of TI devices in accordance with a clock source signal; and
   a circuit configured to determine phase misalignment between outputs of the plurality of TI devices by
   detecting and comparing phases of a plurality of clock signals, generated by the plurality of CGUs of a reference TI device among the plurality of TI devices, respectively to phases of the plurality of clock signals of each other TI device among the plurality of TI devices,
   determining phase differences between the phases of the plurality of clock signals of the reference TI device and respectively the phases of the plurality of clock signals of each other TI device among the plurality of TI devices, and
   based on the phase differences, aligning phases of the plurlaity of clock signals of each other TI device among the plurality of TI devices respectively with phases of the plurality of clock signals of the reference TI device.

2. The phase detector device of claim 1, wherein the circuit comprises a logic comparator device configured to compare the plurality of clock signals of the reference TI device to the plurality of clock signals of each other TI device among the plurality of TI devices.

3. The phase detector device of claim 2, wherein the logic comparator device comprises:
   an XOR gate configured to detect outputs of dividers of the reference TI device and receive each of the plurality of clock signals from the dividers as a reference clock signal, and to detect outputs of each other TI device among the plurality of TI devices and receive each of the plurality of clock signals from the dividers in each other TI device of the plurality of TI devices as a target clock signal;
   a low pass filter coupled to the XOR gate;
   a voltage divider stage coupled to the low pass filter; and
   an analog-to-digital converter (ADC) coupled to the voltage divider,
   wherein the logic comparator device is configured to i) determine a phase difference between each reference clock signal of the reference TI device and a respective one of the target clock signals of each other TI device among the plurality of TI devices, and ii) adjust phases of the dividers of each other TI device among the plurality of TI devices to align phases of the plurality of clock signals of each other TI device among the plurlaity of TI devices respectively with phases of the plurality of clock signals of the reference TI device.

4. The phase detector device of claim 2, the circuit further comprising:
   a filter configured to convert a time difference between the plurality of clock signals generated by the selected one of the plurality of TI devices and the plurality of clock signals generated by the each other TI devices of the plurality of TI devices to a voltage domain; and
   an analog-to-digital converter configured to measure the time difference in the voltage domain, the circuit being configured to determine the at least one of the time and the phase differences using the measurement of the analog-to-digital converter.

5. The phase detector device of claim 4, the circuit further comprising a voltage divider coupled between the filter and the analog-to-digital converter, the voltage divider configured to regulate an output of the filter provided to the analog-to-digital converter.

6. The phase detector device of claim 2, wherein the logic comparator device comprises:
   an XNOR gate configured to detect outputs of dividers of the reference TI device and receive each of the plurality of clock signals from outputs of dividers of the dividers as a reference clock signal, and to detect outputs of dividers of each other TI device among the plurality of TI devices and receive each of the plurality of clock signals from the dividers in each other TI device among the plurality of TI devices as a target clock signal;
   a high pass filter coupled to the XNOR gate;
   a voltage divider stage coupled to the high pass filter; and
   an analog-to-digital converter (ADC) coupled to the voltage divider,
   wherein the logic comparator device is configured to determine a phase difference between each of the reference clock signals of the reference TI device and a respective one of the target clock signals of each other TI device among the plurality of TI devices.

7. The phase detector device of claim 1, wherein the circuit is configured to compare the plurality of clock signals of the reference TI device to the plurality of clock signals of each other TI device among the plurlaity of TI devices in a round-robin fashion.

8. A multi-instance TI system comprising the phase detector device of claim 1 and further comprising the plurality of TI devices.

9. The multi-instance TI system of claim 8, wherein the plurality of clock generation units of each of the plurality of TI devices is coupled to a respective interleaver network, each of the plurality of clock generation units being configured to (i) generate the respective plurality of clock signals from the clock source signal and (ii) provide the respective plurality of clock signals to the respective interleaver network.

10. The system of claim 9, wherein the plurality of CGUs and the respective interleaver network of each of TI device among the plurality of TI devices matches the plurality of CGUs and the respective interleaver network of each other TI device among the plurality of TI devices.

11. A phase detector device for a time-interleaving (TI) system in a communication network, the phase detector device comprising:
inputs configured to receive respective outputs from a plurality of TI devices, each of the respective outputs being generated by a respective one of the plurality of TI devices in accordance with a predetermined input pattern; and
auto-correlation circuitry configured to determine at least one of time and phase misalignment between the respective outputs of the plurality of TI devices by
comparing outputs generated by a selected one of the plurality of TI devices to outputs generated by each other TI device of the plurality of TI devices,
determining, based on outputs expected in accordance with the predetermined input pattern, correlations between outputs generated by the selected one of the plurality of TI devices and the outputs generated by the each other TI devices of the plurality of TI devices, and
determining at least one of time and phase differences between the outputs generated by the selected one of the plurality of TI devices and the outputs generated by the each other TI devices of the plurality of TI devices based on the determined correlations.

12. The phase detector device of claim 11, wherein the predetermined input pattern includes at least one of a pseudorandom binary sequence, a ramp input, a stair-case input, a spike input, and sinusoidal input, and an alternating offset pattern.

13. The phase detector device of claim 11, wherein the auto-correlation circuitry is configured to determine the correlations in a round-robin fashion.

14. A system comprising the phase detector device of claim 11, further comprising the plurality of TI devices.

15. The system of claim 14, wherein each of the plurality of TI devices includes a respective plurality of clock generation units coupled to an interleaver network, each of the plurality of clock generation units being configured to (i) generate a respective plurality of clock signals from a clock source signal and (ii) provide the respective plurality of clock signals to the interleaver network.

16. A multi-instance time-interleaving (TI) system, the system comprising:
a plurality of TI devices, each of the plurality of TI devices includes a plurality of clock generation units (CGUs) coupled to an interleaver network, the plurality of CGUs being configured to generate respectively a plurality of clock signals from a clock source signal and to provide the plurality of clock signals to the interleaver network; and
a phase detector device coupled to the plurality of TI devices and configured to i) generate a time grid for each of the plurality of clock signals of a reference TI device among the plurality of TI devices, the time grid comprising a plurality of delayed versions of the clock signal generated respectively by a plurality of buffers ii) determine phase differences between phase of each the plurality of clock signals of the reference TI device and respectively phases of the plurality of clock signals of each other TI device among the plurality of TI devices based on the time grids for the plurality of clock signals of the reference TI device, the determining of the phase differences comprising, for each of the plurality of clock signals of the reference TI device, comparing the plurality of delayed versions of the clock signal to one of the plurality of clock signals of each other TI device among the plurality of TI devices, and
iii) align phases of the plurality of clock signals of each other TI device among the plurality of TI devices respectively with phases of the plurality of clock signals of the reference TI device.

17. The system of claim 16, wherein the phase detector device comprises a time-to-digital converter (TDC) device configured to generate the time grids associated with the plurality of clock signals of the reference TI device, and to sample the plurality of clock signals of each other TI device among the plurality of TI devices according to the time grids.

18. The system of claim 17, wherein the TDC device is configured to sample each of the plurality of clock signals of each other TI device among the plurality of TI devices as a target clock signal, and to sample the target clock signals of each other TI device among the plurality of TI devices according to a corresponding one of the time grids until determining a key transition state.

19. The system of claim 17, wherein the TDC device comprises:
a plurality of flip-flop devices configured in series to receive each of the plurality of clock signals from each other TI device among the plurality of TI devices as a target clock signal, each of the plurality of flip-flop devices having a clock input; and
a plurality of buffer devices configured in series and coupled to the plurality of flip-flop devices, the plurality of buffer devices being configured to receive each the plurality of clock signals from the reference TI device as a reference clock signal and to produce a plurality of buffered clock signals based on the reference clock signal to form a respective one of the time grids, and each of the plurality of buffer devices being coupled to and providing one of the plurality of buffered clock signals to the clock input of a flip-flop device of the plurality of flip-flop devices,
wherein at least one of
the plurality of flip-flop devices are configured to sample each of the target clock signals according to a corresponding one of the time grids, and
the TDC device is configured to generate the time grids associated with the plurality of clock signals of the reference TI device, and to sample the plurality of clock signals of each other TI device among the plurality of TI devices according to the time grids in a round-robin fashion.

20. The system of claim 16, wherein the plurality of CGUs and the interleaver network of each TI device among the plurality of TI devices matches the plurality of CGUs and the interleaver network of each other TI device among the plurality of TI devices.

21. A multi-instance time-interleaving (TI) system, the system comprising:

a plurality of TI devices, each of the plurality of TI devices includes a plurality of clock generation units (CCUs) coupled to an interleaver network, the plurality of CGUs being configured to generate respectively a plurality of clock signals from a clock source signal and to provide the plurality of clock signals to the interleaver network, wherein the interleaver network of each of the plurality of TI devices is configured to receive a predetermined input and to produce a data output signal; and an auto-correlation device coupled to the plurality of TI devices, wherein the auto-correlation device is configured to i) receive to the data output signal of a reference TI device of the plurality of TI devices as a reference data output signal, ii) receive each of the data output signals of each other TI device among the plurality of TI devices as a target data output signal, iii) determine a phase correlation between the reference data output signal and the target data output signal, and iv) adjust phases of the plurality of clock signals of each other TI device until a respective phase correlation value reaches a maximum value that aligns the target data output signals to the reference data output signal.

22. The system of claim 21, wherein the predetermined input received by the interleaver network of each TI device among the plurality of TI devices includes a pseudorandom binary sequence (PRBS) data input signal, ramp data input signal, stair-case data input signal, spike data input signal, or a sinusoidal data input signal.

23. The system of claim 22, wherein:

the predetermined input comprises a predetermined alternating offset data pattern;

the reference data output signal includes a reference signal, a reference offset, and a reference noise;

the target data output signal includes a target signal, a target offset, and a target noise;

the auto-correlation device is configured to maximize the correlation between the reference data output signal and each of the target data output signals according to the following:

$$AC=(x_i[t]+õ_i[t]+n_i[t])\odot(x_k[t]+õ_k[t]+n_k[t])=X_{ik}[t]+õ_i[t]\odot õ_k[t]+N_{ik}[t]=B+Õ_{ik}[t]$$

where $x_i[t]$ and $x_k[t]$ are the reference signal and the target signal, respectively; $õ_i[t]$ and $õ_k[t]$ are the reference offset and the target offset respectively; $n_i[t]$ and $n_k[t]$ are the reference noise and target noise, respectively; $X_{ik}[t]$ is an auto-correlation of reference signal and the target signal; $N_{ik}[t]$ is an auto-correlation of the reference noise and the target noise; B is a bias value; and $Õ_{ik}[t]$ is an auto-correlation of the reference offset and the target offset; and the predetermined alternating offset pattern includes an alternating periodic ramp pattern, an alternating periodic spike pattern, or an alternating stair-case pattern.

24. The system of claim 22, wherein at least one of:

the predetermined input received by each of the plurality of TI devices comprises a predetermined alternating state pattern configured to modulate the reference data output signals or target data output signal of the TI device according to an internal state variable;

the auto-correlation device is configured to determine the correlation between the reference data output signal and each of the target data output signals in a round-robin fashion; and the plurality of CGUs and the interleaver network of each of the plurality of TI devices matches the plurality of CGUs and the interleaver network of each other TI device among the plurality of TI devices.

* * * * *